(12) United States Patent
Zhang

(10) Patent No.: US 7,790,510 B1
(45) Date of Patent: Sep. 7, 2010

(54) METAL LID WITH IMPROVED ADHESION TO PACKAGE SUBSTRATE

(75) Inventor: Leilei Zhang, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 380 days.

(21) Appl. No.: 11/972,428

(22) Filed: Jan. 10, 2008

Related U.S. Application Data

(62) Division of application No. 10/796,471, filed on Mar. 9, 2004, now Pat. No. 7,342,298.

(51) Int. Cl.
*H01L 21/44* (2006.01)

(52) U.S. Cl. .................. 438/121; 438/124; 438/127

(58) Field of Classification Search .................. 438/108, 438/121, 122, 124–127; 257/680, 683, 704, 257/712, 713, 717, 718
See application file for complete search history.

(56) References Cited

U.S. PATENT DOCUMENTS

| | | | |
|---|---|---|---|
| 4,604,495 A * | 8/1986 | Watanabe | 438/126 |
| 5,455,456 A | 10/1995 | Newman | |
| 5,468,910 A * | 11/1995 | Knapp et al. | 257/704 |
| 6,246,115 B1 | 6/2001 | Tang et al. | |
| 6,278,182 B1 | 8/2001 | Liu et al. | |
| 6,433,420 B1 | 8/2002 | Yang et al. | |
| 6,462,405 B1 * | 10/2002 | Lai et al. | 257/706 |
| 6,486,564 B2 | 11/2002 | Liu et al. | |
| 6,525,421 B1 | 2/2003 | Chia et al. | |
| 6,654,248 B1 * | 11/2003 | Fishley et al. | 257/712 |
| 7,126,218 B1 * | 10/2006 | Darveaux et al. | 257/706 |

OTHER PUBLICATIONS

Asymtek, "Asymtek Equipment Enhances W. L., Gore's New Flip-Chip Packaging Program," *Total Dispensing Solutions*, Spring 1998, pp. 1-4, published by Asymtek, Carlsbad, California, USA.

* cited by examiner

*Primary Examiner*—Kevin M Picardat
(74) *Attorney, Agent, or Firm*—Scott Hewett

(57) ABSTRACT

A metal lid for packaging semiconductor chips is stamped to form a sloped sidewall with a set-back from the edge of a package substrate. After the metal lid is placed over the semiconductor chip, molding compound is formed around portions of the exposed perimeter of the package substrate and against the sloped sidewall of the lid. The molding compound securely attaches the lid to the package substrate, providing improved reliability to the lid-substrate joint. The lightweight lid also increases standoff when a solder ball-grid array is used to connect the packaged IC to a printed wiring board, improving the reliability of the ball-grid array connections.

16 Claims, 3 Drawing Sheets

METAL LID WITH IMPROVED ADHESION TO PACKAGE SUBSTRATE

FIELD OF THE INVENTION

This invention relates generally to packages for electronic semiconductor devices, and more particularly to a metal lid to be attached to a package substrate for packaging semiconductor devices.

BACKGROUND OF THE INVENTION

Semiconductor integrated circuits ("ICs") are packaged in a variety of package styles. Relatively small ICs have been wire-bonded to a frame and encapsulated in molding compound to form a dual in-line ("DIP") style of packaged ICs. Unfortunately, this approach is not suitable for all ICs, such as ICs that generate a lot of heat. The molding compound does not have sufficiently high thermal conduction to work well with ICs that require good heat dissipation. Metal-ceramic ("ceramic") packages provide superior heat conduction, but are complex, using various metal-ceramic interfaces, and are relatively expensive.

Other IC packaging has been developed that provides good thermal performance by thermally coupling a molded metal lid to the backside of the IC. The IC ("chip") is flipped over ("flip-chip") and electrically connected to the substrate, which is typically a ball-grid array ("BGA")-type package substrate. BGAs use solder bumps on the frontside of the IC, rather than bond wires, to electrically couple the IC to the package substrate. The BGA package substrate often has another set of solder bumps on the bottom of the package substrate that connect to an array of contacts on a printed circuit assembly. The BGA package substrate includes conductive traces that couple the relatively fine-pitch BGA of the IC to an array of contacts on the printed circuit assembly, which has a relatively coarse pitch.

A pedestal molded into the metal lid is thermally coupled to the backside of the IC with thermal grease. The metal lid also includes a channel around the pedestal that provides space for chip capacitors, which are thicker than the IC and are often soldered to the substrate around the perimeter of the IC. A flat perimeter region of the molded metal lid is attached to the perimeter of the package substrate with adhesive, such as epoxy.

Unfortunately, the molded metal lid is relatively heavy, being more than 60% (12.5 g) of the total package weight (20 g) in a package for a 1-inch square IC. The molding process uses nickel-plated copper typically about 0.094 inches thick to form the lids.

The perimeter areas of the package substrate that the molded metal lid is attached to are quite narrow (about 2 mm to about 3 mm), and provide relatively little surface area for the adhesive contact. The molded metal lids occasionally come off during shipping of the packaged IC, assembly of the packaged IC into an electronic product, or during shipping of the electronic product.

It is desirable to provide a more reliable lid for use with IC packages, namely a lid that is less likely to come off the package substrate due to mechanical shock or vibration.

SUMMARY OF THE INVENTION

A package lid for attaching to a package substrate of a packaged semiconductor is provided. In one embodiment, the package lid has a sloped wall configured to provide an exposed perimeter portion of the package substrate when the package lid is disposed on the package substrate to allow application of a molding compound on the exposed perimeter portion of the package substrate. The molding compound contacts the sloped wall to secure the package lid to the package substrate of the packaged semiconductor. In particular embodiments the sloped wall has a slope angle between 30 degrees and 60 degrees. The package lid optionally includes a foot around at least a portion of the perimeter of the sloped wall.

In some embodiments, the package lid is stamped from metal sheet less than 2.39 mm thick, which reduces the weight of the package lid compared to similar molded metal lids. In particular embodiments, the package lid is stamped from metal sheet, such as nickel-plated copper or aluminum, about 0.45 mm thick to about 0.79 mm thick, providing light weight, good heat coupling from the IC, and sufficient strength. A vent is optionally provided to allow gases to escape from the interior of the package when the packaged semiconductor is soldered to a printed circuit board.

In another embodiment, a semiconductor integrated circuit is packaged by attaching the semiconductor integrated circuit to a package substrate. A package lid having a sloped wall is placed on the package substrate over the semiconductor IC to leave an exposed perimeter portion of the package substrate. Molding compound is applied to the exposed perimeter portion of the package substrate and the sloped wall. The molding compound is hardened, such as by curing, to attach the package lid to the package substrate to provide a packaged integrated circuit.

DETAILED DESCRIPTION

A package lid for packaging ICs is pressed, drawn, or similarly formed from relatively thin metal, typically about one-third or less of the thickness of a corresponding molded metal lid. In some embodiments, the package lid is secured to a package substrate using molding compound. A pressed package lid is less likely to fail by separating from the package substrate due to mechanical shock or vibration than heavier, molded package lids. Forming the package lid from relatively thin metal sheet also provides a shorter thermal path from the backside of the IC to the exterior surface of the package lid, allowing superior thermal coupling to a heat sink.

Figure 1A:
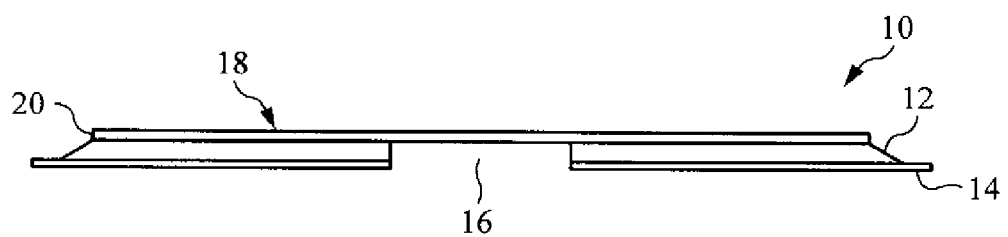
FIG. 1A is a simplified side view of a package lid according to an embodiment of the present invention.

FIG. 1A is a simplified side view of a package lid 10 according to an embodiment of the present invention. The package lid 10 is stamped out of metal sheet, which is typically less than about 2.39 mm (0.09 inches) thick, and about 0.45 mm (0.0177 inches) to about 0.79 mm (0.031 inches) thick in particular embodiments, which provide light weight, suitable strength, and low thermal resistance. Package lids less than the thickness of molded metal lids, reduce failure of packaged ICs due to the lid separating from the package as a result of mechanical shock. The lid is nickel-plated copper but other metals, such as aluminum, are alternatively used, and other forming processes are alternatively used. In applications where it is desirable to extract heat through the package lid 10, using a metal with good thermal conductivity for the lid is generally desirable.

The package lid 10 includes a sloped wall 12 at an angle between about 30 degrees to about 60 degrees from the horizontal. The sloped wall 12 provides a surface that cooperates with molding compound when the package lid 10 is attached to a package substrate (see FIG. 2A, ref. numbers 24, 30).

The molding compound provides a force against the package lid 10 that has both transverse and normal components to reliably secure the package lid to the package substrate. In prior art packages using molded lids, the adhesive used to attach the molded lids to the package substrate was put in shear when the packaged IC was subjected to mechanical shock or vibration. Several packaged ICs failed when the lid separated from the remainder of the packaged device.

An optional "foot" 14 extends from the sloped wall 12 at perimeter portions of the package lid 10. The foot 14 provides more flat area against the package substrate.

An optional vent(s) 16 is provided in the side of the package lid 10 to allow gases to escape during package assembly and assembly of the packaged IC to a printed circuit assembly, which is typically a solder-reflow type of process. In a particular embodiment, the vent 16 comprises a gap in the sloped wall 12. Alternatively, the sloped wall 12 is continuous around the perimeter of the package lid 10 and a vent hole is provided in the top 18 or side of the package lid 10. An optional rim 20 provides a vertical wall.

Figure 1B:
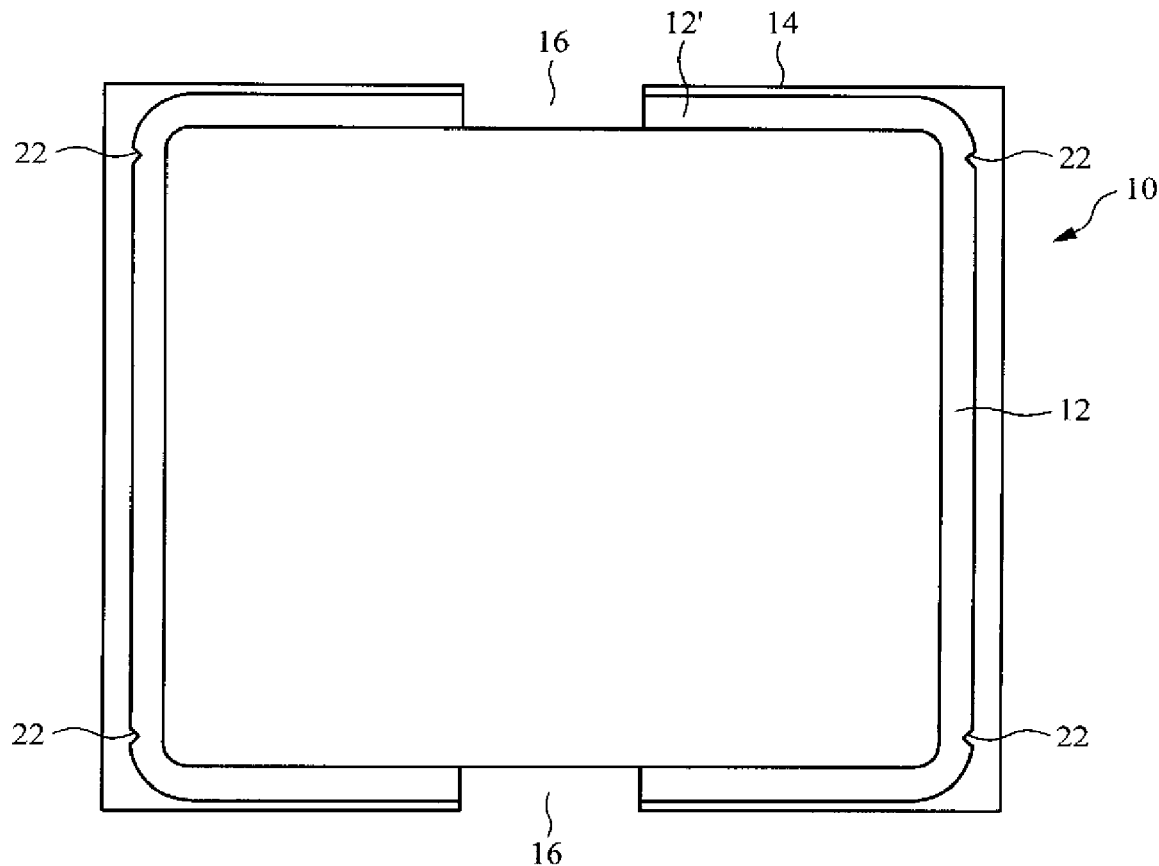
FIG. 1B is a simplified plan view of the package lid of FIG. 1A.

FIG. 1B is a simplified plan view of the package lid 10 of FIG. 1A. The package lid 10 is square (rectangular) to accommodate a square (rectangular) semiconductor chip. Most semiconductor chips are rectangular. Rectangular packages are preferred for large and very large semiconductor chips to avoid taking up too much area on a printed circuit assembly. The packages are often designed to be as small as possible to accommodate large semiconductor chips and ancillary components that are assembled in the package, such as chip capacitors.

Optional vents 16 are provided on two sides of the package lid 10. Alternatively, a single vent or a vent hole is provided. Fiducial marks 22 are provided near the corners of the package lid 10 to aid in holding the package lid and placing it on a package substrate.

Figure 1C:
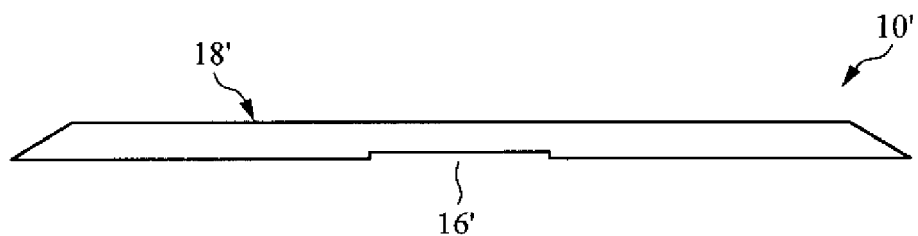
FIG. 1C is a simplified side view of a package lid according to another embodiment of the present invention.

FIG. 1C is a simplified side view of a package lid 10' according to another embodiment of the present invention. The package lid 10' omits the foot and rim (ref. nums. 14 and 20) shown in FIG. 1A. A vent 16' does not extend to the top 18' of the package lid 10' in this embodiment, but does extend to the top 18' in alternative embodiments.

Figure 2A:
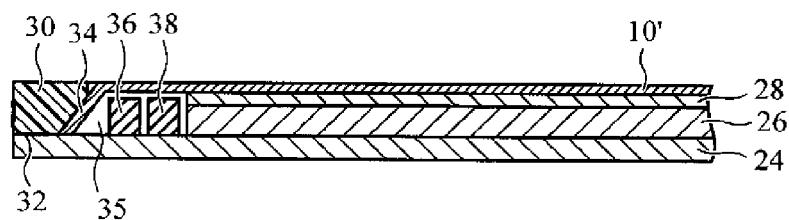
FIG. 2A is a simplified cross section of a package lid assembled to a package substrate according to an embodiment of the present invention.

FIG. 2A is a simplified cross section of the package lid 10' of FIG. 1C assembled to a package substrate 24 taken across the solid portion of section line A-A' of FIG. 2B, below. The entire cross section is not shown (i.e. the dashed portion of section line A-A' is not shown) to allow clear labeling of layered features on the right side of the cross section. The package substrate 24 typically includes a printed circuit board material, such as one based on bismaleimide triazine ("BT") resin or other polymer. A semiconductor IC 26 is mechanically and electrically coupled to the package substrate 24, such as with a BGA attachment (not shown). An optional pedestal 28 is provided between the semiconductor IC 26 and the package lid 10' to facilitate thermal conduction between the semiconductor 26, where heat is generated, and the package lid 10', which is optionally coupled to a heat sink or heat dissipater (not shown). Alternatively, the pedestal 28 is omitted and thermal grease is used between the semiconductor IC 26 and the package lid 10'.

Molding compound 30 is applied in a plastic or fluid state to an exposed perimeter portion 32 of the surface of the package substrate 24. The exposed perimeter portion 32 extends from the end of the sloped wall 34 to the edge of the package substrate 24, and hence is exposed to the molding compound. The molding compound is generally a polymer-based material, such as a silicone thermosetting transfer material, a phenolic resin, or an epoxy resin, which may optionally be mixed with filler material. The molding compound adheres well to both the material of the package substrate 24 and to the metal package lid 10' when it sets into a solid, and has sufficient mechanical strength and toughness to secure the package lid 10' to the package substrate 24, even with exposed to severe mechanical shock. The molding compound 30 contacts the sloped wall 34 of the package lid 10'.

The angle of the sloped wall 34 is usually between about 30 degrees and about 60 degrees. At angles less than 30 degrees, the sloped wall takes up too much room on the package substrate. At angles greater than 60 degrees, the force normal to the package substrate decreases. If the angle of the sloped wall exceeds 60 degrees, a foot (see FIG. 1A, ref. num. 14) is optionally added to provide a surface for the molding compound to assert a normal force against. If the angle of the sloped wall is less than 30 degrees, a rim (see FIG. 1A, ref. num. 20) is optionally added to provide a surface for the molding compound to assert a lateral force against.

Chip capacitors 36, 38 are frequently mounted on the package substrate 24 around the perimeter of the semiconductor IC 26. The space 35 around the chip capacitors 36, 38 is not filled with molding compound. The set-back from the edge of the package substrate 24 to the chip capacitors 36, 38 is typically about 2-3 mm in some embodiments. The sloped wall 34 and molding compound therefore fit within the setback, leaving enough of an exposed perimeter portion 32 of the surface of the package substrate 24 for the molding compound to bond to. In a particular embodiment, about 2 mm to about 3 mm of the perimeter of the package substrate 24 was exposed in the areas with molding compound 30. In prior art package assemblies using molded metal lids, the perimeter of the molded lid attached to the package substrate is also about 2 mm to about 3 mm. However, this amount of contact area proved insufficient to reliably secure the heavy molded lid to the substrate with epoxy adhesive. Several types of commercially available epoxy adhesives were tried, none of which worked acceptably.

Chip capacitors 36, 38 are often thicker than the semiconductor IC 26, and a pedestal 28 or thermal grease is used to fill the difference in height between the backside of the semiconductor IC 26 and the package lid 10'. Alternatively, a well (not shown) is stamped in the package lid to lower that portion of the package lid over the semiconductor IC while providing sufficient height for the chip capacitors.

Figure 2B:
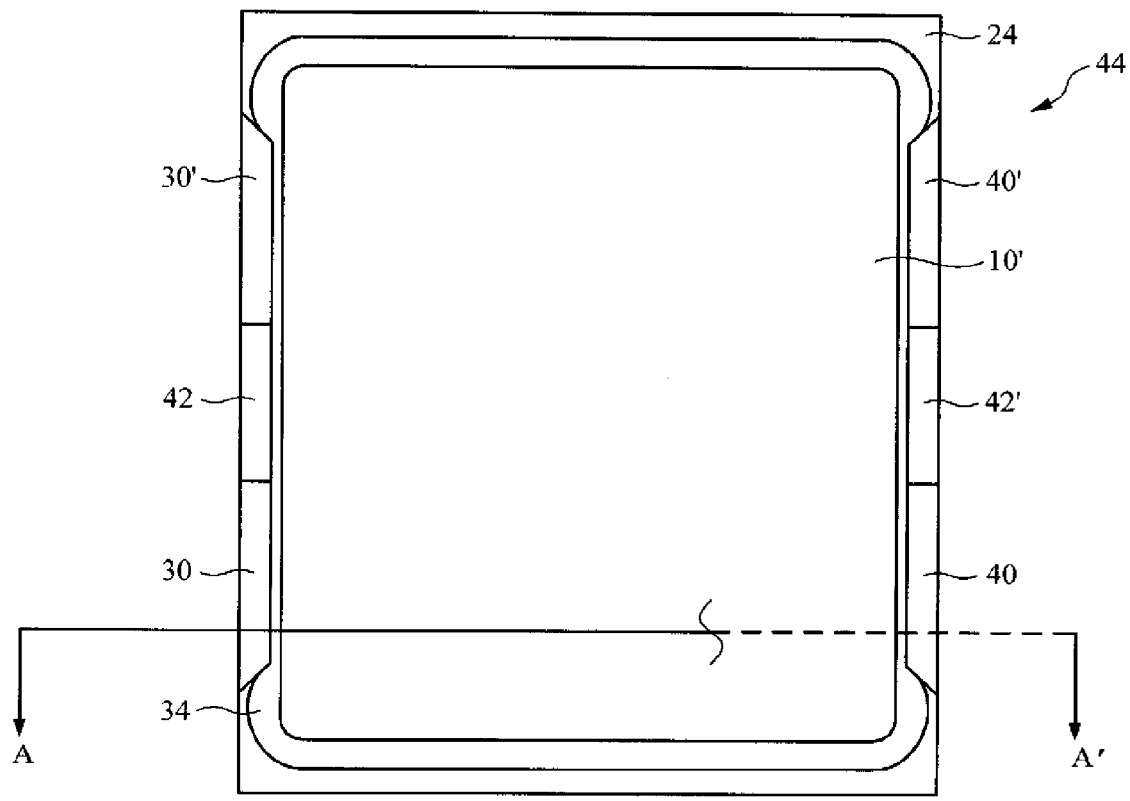
FIG. 2B is a simplified plan view of the package lid and substrate shown in FIG. 2A.

FIG. 2B is a simplified plan view of the package lid and substrate shown in FIG. 2A. Molding compound 30, 30', 40, 40' is formed against the package substrate 24 and sloped wall 34 of the package lid 10' in a plastic or fluid state and allowed to cure into a solid. Vents 42, 42' are provided along two sides of the package lid 10'. The molding compound is sufficiently strong, tough, and adherent to both the stamped metal lid 10' and the material of the package substrate 24 that it does not have to be applied around the entire perimeter of the package lid 10', or even along all four sides.

In a particular embodiment, only about 2 mm to about 3 mm of the package substrate 24 was exposed from the sloped wall 34 of the package lid 10', and provided sufficient adhesion to secure the package lid 10'. It is desirable to provide room inside the package lid 10' for the semiconductor IC, chip capacitors, and other components of the packaged semiconductor 44.

In one embodiment, the package substrate 24 is approximately 63.5 mm (2.5 inches) square, and the packaged semiconductor 44 includes a semiconductor IC ("chip") approximately 25 mm (1 inch) square. In particular embodiments, the semiconductor IC is a programmable logic device ("PLD"), such as a complex logic device ("CLD") or a field-programmable gate array ("FPGA"). Providing lightweight lids that are securely attached to the package substrate are particularly desirable for such physically large semiconductor chips because conventional (e.g. molded metal) lids are unreliable when subjected to mechanical shock, and can detach from the package substrate.

Many large semiconductor ICs are what are commonly known as very large scale integration ("VLSI") ICs or ultra large scale integration ("ULSI") ICs. VLSI and ULSI circuits have many contact pads that are difficult and/or expensive to electrically connect to a printed circuit assembly using leadframe and wire-bonding techniques. As discussed above, BGAs are used with packaged semiconductors having a large number of contacts. BGAs allow electrical connection to the printed circuit assembly using a high-density array of solder balls.

An advantage of lowering the weight of the package lid by using a thin, stamped, metal lid instead of a thick, molded metal lid is that reliability of the solder BGA connection between the packaged IC and a printed circuit assembly incorporating the packaged IC improves. The distance between a printed circuit assembly and a packaged IC using a BGA is known as "standoff".

Packaged ICs using conventional molded lids and lids according to exemplary embodiments of the present invention were attached to printed circuit boards using BGAs and tested for their susceptibility to vibration. The packaged ICs using conventional molded lids had a higher failure rate (shorter lifetime). It is believed the higher failure rate was due to the reduced standoff resulting from the heavy molded metal package lid, which applied more force on the BGA solder bumps during solder re-flow. The lighter, stamped lid did not apply as much weight to the BGA between the packaged IC and the printed circuit board. It is believed that the greater standoff allows a longer solder joint that is more compliant and less likely to shear and fail when subjected to vibration.

Figure 2C:
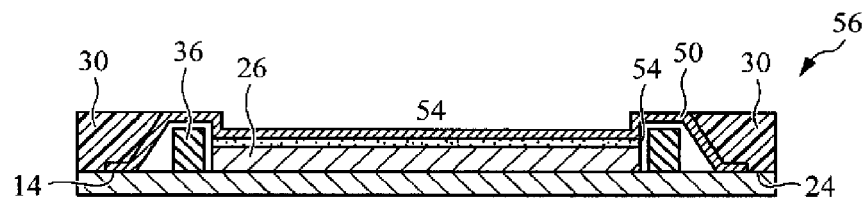
FIG. 2C is a simplified cross section of a portion of a package lid assembled to a package substrate according to another embodiment of the present invention.

FIG. 2C is a simplified cross section of a package lid 50 assembled to a package substrate 24 according to another embodiment of the present invention. The package lid 50 includes a well 52 that is stamped or otherwise formed in the lid 50. The well brings the portion of the lid 50 overlying the semiconductor IC 26 into close proximity and/or contact with the semiconductor IC 26, allowing good thermal coupling between the lid 50 and the semiconductor IC 26. Thermal grease 54 is optionally provided between the lid 50 and semiconductor IC 26 to further facilitate heat removal from the semiconductor IC 26.

The well 52 allows sufficient height for other, taller components, such as chip capacitors 36, within the package assembly 56. Molding compound 30 secures the package lid 50 to the package substrate 24. The package lid 50 includes an optional foot 14.

Figure 3:
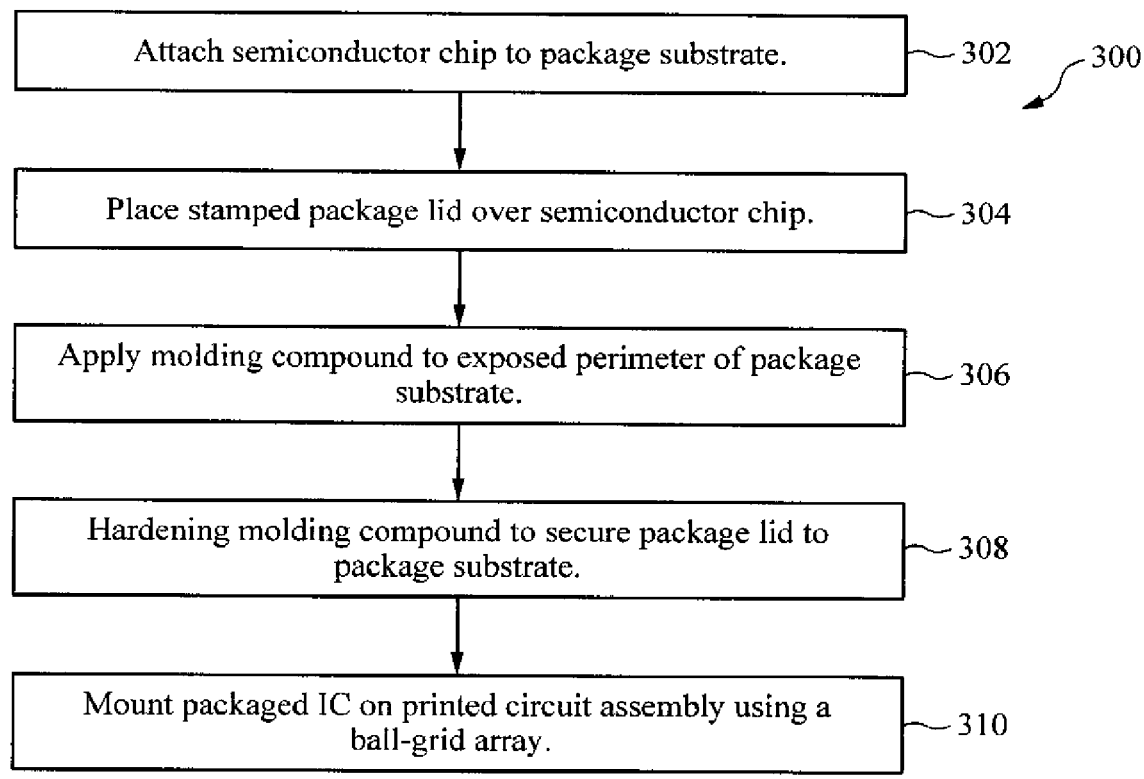
FIG. 3 is a flow chart of a method for assembling a packaged IC according to an embodiment of the present invention.

FIG. 3 is a flow chart of a method 300 for assembling a packaged IC according to an embodiment of the present invention. A semiconductor IC is attached to a package substrate (step 302). In a particular embodiment, the package substrate is a polymer-based printed circuit board assembly and the semiconductor IC is electrically and mechanically coupled to the package substrate with a first BGA. A package lid having a sloped wall is placed over the semiconductor IC on the package substrate leaving an exposed perimeter portion of the package substrate (step 304). Molding compound is applied in a plastic or fluid state to the exposed perimeter portion of the package substrate and against the sloped wall of the substrate (step 306), and allowed to harden to securely attach the package lid to the package substrate (step 308). In a further embodiment, a packaged IC having a first BGA coupling the semiconductor IC to the package substrate is mounted on a printed circuit assembly using a second BGA (step 310). The solder bumps used in the first BGA typically have a higher melting point than the solder bumps used in the second BGA.

In the foregoing specification, exemplary embodiments of the invention have been described. Other embodiments will be apparent to those of ordinary skill in the art. For example, a solid preform could be attached to the exposed perimeter of the package substrate and sloped wall of the package lid using a conformable adhesive, or molding compound could be provided in powder form. Thus, it is evident that various modifications and changes may be made thereunto without departing from the broader spirit and scope of the invention as set forth in the appended claims and their full scope of equivalents.

The invention claimed is:

1. A method of packaging a semiconductor integrated circuit (IC) comprising:
   attaching the semiconductor IC to a package substrate;
   placing a package lid having a sloped wall on the package substrate over the semiconductor IC to leave an exposed perimeter portion of the package substrate and to leave a space between the semiconductor IC and the package lid;
   applying molding compound to the exposed perimeter portion of the package substrate and the sloped wall and not within the space; and
   hardening the molding compound to attach the package lid to the package substrate to provide a packaged integrated circuit.

2. The method of claim 1 wherein the step of attaching the semiconductor integrated circuit to the package substrate comprises a first solder re-flow process of a first ball-grid array.

3. The method of claim 2 further comprising a step, after the step of hardening the molding compound to attach the package lid to the package substrate, of attaching the packaged integrated circuit to a printed circuit board using a second solder re-flow process of a second ball-grid array.

4. The method of claim 1 wherein the molding compound is applied in a plastic or fluid state.

5. The method of claim 1 further comprising a step, prior to the step of placing the package lid having the sloped wall on the package substrate over the semiconductor IC, of stamping the package lid out of metal.

6. The method of claim 5 wherein the metal comprises nickel-plated copper.

7. The method of claim 5 wherein the metal is less than 0.79 mm thick.

8. The method of claim 5 wherein the metal is about 0.79 mm thick.

9. The method of claim 1 wherein the exposed perimeter portion is about 1 mm wide.

10. The method of claim 1 wherein the package lid includes a vent and wherein applying molding compound excludes applying molding compound to the vent.

11. The method of claim 1 further comprising, before applying molding compound, applying thermal grease to the semiconductor integrated circuit.

12. The method of claim 11 wherein placing the package lid thermally couples the package lid to the semiconductor integrated circuit through the thermal grease.

13. The method of claim 1 wherein applying molding compound includes applying molding compound only to the exposed perimeter portion of the package substrate and not to other portions of the package substrate.

14. The method of claim 1 wherein:
the package lid includes a sidewall vent in a first side of the package lid; and
applying molding compound includes applying a first molding compound portion along the first side and applying a second molding compound portion along the first side, the sidewall vent being disposed between the first molding compound portion and the second molding compound portion.

15. The method of claim 1 wherein applying molding compound to the exposed perimeter portion includes applying molding compound along a first side of the package lid and along a second side of the package lid, the second side being opposite the first side, and not along a third side of the package lid or along a fourth side of the package lid.

16. A method of packaging a semiconductor integrated circuit (IC) comprising:
attaching the semiconductor IC to a package substrate;
applying thermal grease to at least one of the semiconductor IC and a package lid having a vent and a sloped wall;
attaching chip capacitors to the package substrate;
placing the package lid on the package substrate over the semiconductor IC to leave an exposed perimeter portion of the package substrate;
applying molding compound to the exposed perimeter portion of the package substrate and the sloped wall and not within the vent; and
hardening the molding compound to attach the package lid to the package substrate to provide a packaged integrated circuit.

* * * * *